(12) United States Patent
De et al.

(10) Patent No.: US 6,300,819 B1
(45) Date of Patent: *Oct. 9, 2001

(54) CIRCUIT INCLUDING FORWARD BODY BIAS FROM SUPPLY VOLTAGE AND GROUND NODES

(75) Inventors: Vivek K. De, Beaverton; Ali Keshavarzi, Portland; Siva G. Narendra; Shekhar Y. Borkar, both of Beaverton, all of OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/078,395

(22) Filed: May 13, 1998

Related U.S. Application Data

(63) Continuation-in-part of application No. 08/880,047, filed on Jun. 20, 1997, now Pat. No. 6,166,584.

(51) Int. Cl.[7] .................................................. G05F 1/10
(52) U.S. Cl. .............................................. 327/534; 327/537
(58) Field of Search ................................... 327/530, 534, 327/535, 537, 538; 326/36

(56) References Cited

U.S. PATENT DOCUMENTS

| 4,377,756 | 3/1983 | Yoshihara et al. ............... 307/296 R |
| 4,565,960 | 1/1986 | Takata et al. ...................... 323/317 |

(List continued on next page.)

OTHER PUBLICATIONS

Splain et al, "Ultra Low Voltage Complementary Metal Oxide Semiconductor (ULV–CMOS) Circuits," Southeastcon 96. Bringing Together Education, Science and Technology Proceedings of the IEEE, pp. 670–673, 1996.*

Kioi* et al, "Forward body–bias MOS (FBMOS) dual rail logic using an adiabatic charging technique with sub–O.6v operation," Electronics Letters 3rd Jul. 1997 vol. 33 No. 14, pp. 1200–1201.*

(List continued on next page.)

*Primary Examiner*—Jung Ho Kim
(74) *Attorney, Agent, or Firm*—Alan K. Aldous

(57) ABSTRACT

One embodiment of the invention includes a semiconductor circuit including a ground voltage node to provide a ground voltage and pFET transistors having an n-type body electrically coupled to the ground voltage node to forward body bias the pFET transistors. Another embodiment of the invention includes a semiconductor circuit including a supply voltage node to provide a supply voltage and nFET transistors having a p-type body electrically coupled to the supply voltage node to forward body bias the nFET transistors. Still another embodiment of the invention includes a semiconductor circuit including a ground voltage node to provide a ground voltage and pFET transistors having an n-type body electrically coupled to the ground voltage node to forward body bias the pFET transistors. The circuit also includes a supply voltage node to provide a supply voltage and nFET transistors having a p-type body electrically coupled to the supply voltage node to forward body bias the nFET transistors.

26 Claims, 11 Drawing Sheets

U.S. PATENT DOCUMENTS

| | | | |
|---|---|---|---|
| 4,964,082 | 10/1990 | Sato et al. | 365/189.09 |
| 5,461,338 | 10/1995 | Hirayama et al. | 327/534 |
| 5,489,870 | 2/1996 | Arakawa | 327/536 |
| 5,491,432 | 2/1996 | Wong et al. | 326/86 |
| 5,557,231 | 9/1996 | Yamaguchi et al. | 327/534 |
| 5,559,368 | 9/1996 | Hu et al. | 257/369 |
| 5,594,696 | 1/1997 | Komarek et al. | 365/208 |
| 5,656,970 | 8/1997 | Campbell et al. | 327/565 |
| 5,661,414 | 8/1997 | Shigehara et al. | 326/81 |
| 5,689,144 | 11/1997 | Williams | 307/130 |
| 5,689,209 | 11/1997 | Williams et al. | 327/425 |
| 5,812,015 * | 9/1998 | Tobita | 327/534 |
| 5,814,899 * | 9/1998 | Okumura et al. | 307/64 |
| 5,821,805 | 10/1998 | Jinbo | 327/537 |
| 5,838,047 | 11/1998 | Yamauchi et al. | 257/372 |
| 5,841,299 | 11/1998 | De et al. | |
| 5,854,561 | 12/1998 | Arimoto et al. | 327/534 |
| 5,900,665 | 5/1999 | Tobita | 257/357 |
| 5,905,402 * | 5/1999 | Kim et al. | 327/536 |
| 5,929,695 | 7/1999 | Chan et al. | 327/537 |
| 5,986,476 | 11/1999 | De | 326/98 |
| 6,097,113 * | 8/2000 | Teraoka et al. | 327/534 |
| 6,177,811 * | 1/2001 | Fuse et al. | 327/534 |

OTHER PUBLICATIONS

Antoniadis, D.A. et al., "Physics and Technology of Ultra Short Channel MOSFET Devices," 1991 IEDM Technical Digest, pp. 21–24.

Aoki, M. et al., "0.1 µm CMOS Devices Using Low–Impurity–Channel Transistors (LICT), " 1990 IEDM Technical Digest, pp. 939–941.

Assaderaghi, F. et al., "A Dynamic Threshold Voltage MOSFET (DTMOS) for Ultra–Low Voltage Operation", 1994 IEDM Technical Digest, pp. 809–812.

Assaderaghi, F. et al., "High–Performance Sub–Quarter–Micrometer PMOSFET's on SOI," IEEE Electron Device Letters, vol. 14, No. 6, Jun. 1993, pp. 298–300.

Benedetto, J., "Economy–Class Ion–Defying IC s in Orbit", IEEE Spectrum, Mar. 1998, pp. 36–41.

DeChiaro, L.F. et al., "Improvements in Electrostatic Discharge Performance of InGaAsP Semiconductor Lasers by Facet Passivation," IEEE Transactions on Electron Devices, vol. 39, No. 3, Mar. 1992, pp. 561–565.

Kawaguchi, H. et al., "FP 12.4: A CMOS Scheme for 0.5V Supply Voltage With Pico–Ampere Standby Current", 1998 IEEE International Solid–State Circuits Conference, Digest of Technical Papers, Feb. 6, 1998, pp. 192–193.

Kioi, K. et al., "Forward Body–Bias MOS (FBMOS) Dual Rail Logic Using an Adiabatic Charging Technique With Sub –0.6V Operation", Electronics Letters, vol. 33, No. 14, Jul. 3, 1997, pp. 1200–1201.

Kioi, K. et al., "Forward Body–Bias SRAM Circuitry on Bulk Si With Twin Double–Well", Electronics Letters, vol. 33, No. 23, Nov. 6, 1997, pp. 1929–1931.

Kobayashi, T. et al., "Self–Adjusting Threshold–Voltage Scheme (SATS ) for Low–Voltage High–Speed Operation", Proceedings of the IEEE 1994 Cutom Integrated Circuits Conference, May 1–4, 1994, pp. 271–274.

Kotaki, K. et al., "Novel Bulk Dynamic Threshold Voltage MOSFET (B–DTMOS) with Advanced Isolation (SITOS) and Gate to Shallow–Well Contact (SSS–C) Processes for Ultra Low Power Dual Gate CMOS," International Electron Devices Meeting 1996, Dec. 8–11, 1996, pp. 459–462.

Kuroda, T. et al, "A 0.9–V, 150–MHz, 10–mW, 4 mm$^2$, 2–D Discrete Cosine Transform Core Processor with Variable Threshold–Voltage (VT) sscheme", IEEE Journal of Solid–State Circuits, vol. 31, No. 11, Nov. 1996, pp. 1770–1779.

Kuroda, T. et al, "FA 10.3: A 0.9V 150 MHz 10mW 4mm$^2$ 2–D Discrete Cosine Transform Core Processor with Variable Threshold–voltage Scheme," 1996 IEEE International Solid–State Circuits Conference, Feb. 1996. pp. 166–167.

Kuroda, T. et al., "A High–Speed Low–Power 0.3µm CMOS Gate Array With Variable Threshold Voltage (VT) Scheme", IEEE 1996 Custom Integrated Circuits Conference, May 5–8, 1996, pp. 53–56.

Kuroda, T. et al., "Substrate Noise Influence on Circuit Performance in Variable Threshold–Voltage Scheme," 1996 International Symposium on Low Power Electronics and Design Digest of Techinical Papers, Aug. 12–14, 1996, pp. 309–312.

Kuroda, T. et al., "Threshold–Voltage Control Schemes through Substrate–Bias for Low–Power High–Speed CMOS LSI Design," Journal of VLSI Signal Processing Systems 13, 191–201 (1996), pp. 107–117.

Kuroda, T. et al, "Variable Supply–Voltage Scheme for Low–Power High–Speed CMOS Digital Design", IEEE Journal of Solid–State Circuits, vol. 33, No. 3, Mar. 1998, pp. 454–462.

Krishnan, S. et al., "BiMOS Modeling for Reliable SOI Circuit Design," 1996 IEEE International SOI Conference Proceedings, Sep. 30–Oct. 3, 1996, pp. 140–141.

Mizuno, H. et al, "A Lean–Power Gigascale LSI Using Hierarchical $V_{BB}$ Routing Scheme with Frequency Adaptive $V_T$ CMOS", Symposium on VLSI Circuits Digest of Technical Papers, Jun. 1997, pp. 95–96.

Mizuno, M. et al., "SA 18.2: Elastic–Vt CMOS Circuits for Multiple On–Chip Power Control", 1996 IEEE International Solid–State Circuits Conference, Feb. 8–10, 1996, pp. 300–301.

Mutoh, S. et al., "1V High–Speed Digital Circuit Technology With 0.5µm Multi–Threshold CMOS", 1993 IEEE ASIC Conference Proceedings, pp. 186–189.

Mutoh, S. et al., "1–V Power Supply High–Speed Digital Circuit Technology with Multithreshold–Voltage CMOS," IEEE Journal of Solid–State Circuits, vol. 30, No. 8, Aug. 1995, pp. 847–854.

Oowaki, Y. et al, "A Sub–0.1µm Circuit Design With Substrate–Over–Biasing," 1998 IEEE International Solid–State Circuits Conference, Feb. 5, 1998, pp. 88–89 & 420.

Rodder, M. et al., "A Sub–0.18µm Gate Length CMOS Technology for High Performance (1.5V) and Low Power (1.0V),"1996 IEDM Technical Digest, pp. 563–566.

Rofail, S.S. et al., "Experimentally–Based Analytical Model of Deep–Submicron LDD pMOSFET's in a Bi–MOS Hybrid–Mode Environment," IEEE Transactions on Electron Devices, vol. 44, No. 9, Sep. 1997, pp. 1473–1482.

Sakurai, T. et al., "Low–Power CMOS Design Through $V_{TH}$ Control and Low–Swing Circuits", Proceedings 1997 International Symposium on Low Power Electronics and Design, Aug. 18–20, 1997, pp. 1–6.

Seta, K. et al., "FP 19.4: 50% Active–Power Saving Without Speed Degradation Using Standby Power Reduction (SPR) Circuit", 1995 IEEE International Solid–State Circuits Conference Digest of Technical Papers, Feb. 1995, pp. 318–319.

Splain, C. et al., "Ultra Low Voltage Complementary Metal Oxide Semiconductor (ULV–CMOS) Circuits: Bulk CMOS Operation Below Threshold ($V_{TO}$)," IEEE Southeastcon '96, Apr. 11–14, 1996, pp. 670–673.

Streetman, B., *Solid State Electronic Devices*, pp. 317–319 (Prentice–Hall, Inc., 2nd Edition, 1980).

Thompson, S. et al., "Dual Threshold Voltages and Substrate Bias: Keys to High Performance, Low Power, 0.1 μm *Logic Designs*," 1997 Symposium on VLSI Technology Digest of Technical Papers, pp. 69–70.

Vasudev, P. et al., "Si–ULSI With a Scaled–Down Future: Trands and Challenges for ULSI Semiconductor Technology in the Coming Decade", IEEE Circuits & Devices, Mar. 1998, pp. 19–29.

Walker, W. et al., "Design and Analysis of a CMOS SOS/ SOI Receiver for a Radiation Hard Computer," 1989 IEEE SOS/SOI Technology Conference, Oct. 3–5, 1989, pp. 167–168.

Wann, H. Clement et al., "Channel Doping Engineering of MOSFET with Adaptable Threshold Voltage Using Body Effect for Low Voltage and Low Power Applications," 1995 International Symposium on VLSI Technology, Systems and Applications, Proceedings of Technical Papers, May 31–Jun. 2, 1995, pp. 159–163.

Wann, Clement H., et al., "A Comparative Study of Advanced MOSFET Concepts," IEEE Transactions on Electron Devices, vol. 43, No. 10, Oct. 1996, pp. 1742–1753.

Williams, R. et al., "MOSFET Flyback–Diode Conduction and dVldt Effects in Power ICs in Low–Voltage Motor Control Applications," Proceedings of the 3rd International Symposium on Power Semiconductor Devices and ICs, Apr. 22–24, 1991, pp. 254–257.

* cited by examiner

CIRCUIT INCLUDING FORWARD BODY BIAS FROM SUPPLY VOLTAGE AND GROUND NODES

RELATED APPLICATION

This application is a continuation-in-part of application Ser. No. 08/880,047, filed Jun. 20, 1997, pending.

The present application and concurrently filed Appl. Ser. No. 09/078,432 entitled "Forward Body Bias Circuit Providing Multiple Threshold Voltages" U.S. Pat. No. 6,100,251, Appl. Ser. No. 09/078,424 entitled "multiple Well Transistor Circuits Having Forward Body Bias" U.S. Pat. No. 6,218,895, and Appl. Ser. No. 09/078,388 entitled "Transistors Providing Desired Threshold Voltage And Reduced Short Channel Effects With Forward Body Bias" U.S. Pat. No. 6,232,827, which are continuations-in-part of application Ser. No. 08/880,047, filed Jun. 20, 1997, U.S. Pat. No. 6,166,584, have overlapping disclosures.

BACKGROUND OF THE INVENTION

1. Technical Field of the Invention

The present invention relates to semiconductor circuits and, more particularly, to semiconductor circuits in which the bodies of at least some transistors are forward-biased.

2. Description of Prior Art

In conventional static, dynamic, and differential complementary metal oxide semiconductor (CMOS) logic and memory circuits, an n-Channel metal oxide semiconductor field effect transistor (MOSFET)(nMOS transistor) or a p-Channel MOSFET (pMOS transistor) is used with its body terminal connected to the ground or supply voltage node, respectively. Other circuit schemes have been proposed where a reverse bias is applied statically or dynamically to the body node of a MOSFET to reduce subthreshold leakage current when the MOSFET is not switching. In these schemes, the body of the pMOS transistor is connected to a voltage source larger (more positive) than the supply voltage, and the body of the nMOS transistor is connected to a voltage source smaller (more negative) than the ground potential.

The maximum achievable performance and the minimum supply voltage allowed at a desired performance level in microprocessor and communication chips which use the above-recited schemes may be limited by 1) the intrinsic transistor drive current and 2) the controllability of device parameters offered by the process technology. The predominant source of device parameter fluctuations across a die may be a variation of critical dimension (CD). In order that the MOSFET characteristics do not vary by unacceptably large amounts in response to CD-variations, the device may be carefully engineered to have sufficiently large margin for short-channel-effect (SCE), drain-induced-barrier-lowering (DIBL), and punch-through (PT) immunity. As the minimum feature size scales below, for example, 0.18 micrometers, the available design space for construction of a MOSFET which provides sufficient drive current at low supply voltages while maintaining adequate SCE, DIBL, and PT immunity becomes severely restricted. These design challenges for ultra-small bulk MOSFETs can pose a major barrier to achieving the performance and power goals in future generations of microprocessor, communication, and memory chips. In addition, these design difficulties can cause the development cost of future process technologies to escalate by large amounts.

Accordingly, there is a need for transistors that provide relatively high performance at relatively low power.

SUMMARY OF THE INVENTION

One embodiment of the invention includes a semiconductor circuit including a ground voltage node to provide a ground voltage, and pFET transistors having an n-type body electrically coupled to the ground voltage node to forward body bias the pFET transistors.

Another embodiment of the invention includes a semiconductor circuit including a supply voltage node to provide a supply voltage, and nFET transistors having a p-type body electrically coupled to the supply voltage node to forward body bias the nFET transistors.

Still another embodiment of the invention includes a semiconductor circuit including a ground voltage node to provide a ground voltage, and pFET transistors having an n-type body electrically coupled to the ground voltage node to forward body bias the pFET transistors. The circuit also includes a supply voltage node to provide a supply voltage, and nFET transistors having a p-type body electrically coupled to the supply voltage node to forward body bias the nFET transistors.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION OF THE PREFERRED EMBODIMENTS

The following is a table of contents for the specification.
A. Forward Body Bias
B. Forward Body Bias from the Supply and Ground Voltage Nodes
C. Multiple Vt Circuits
D. Soft Error Rate
E. Other Advantages of Forward Body Bias
F. Process of Manufacturing and Structure of Some Preferred Transistors
G. Additional Information Reference in the specification to "one embodiment" or "an embodiment" means that a particular feature, structure, or characteristic described in connection with the embodiment is included in at least one embodiment of the invention. The appearances of the phrase "in one embodiment" or "an embodiment" in different places in the specification are not necessarily all referring to the same embodiment.

A. Forward Body Bias

Figure 1:
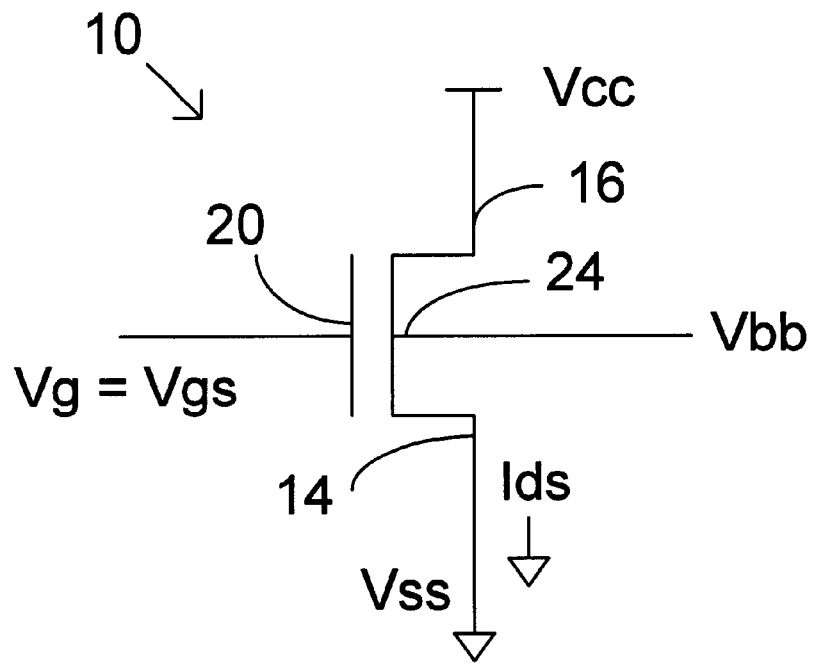
FIG. 1 is a schematic representation of a transistor that may be used in an embodiment of the present invention.
Figure 2:
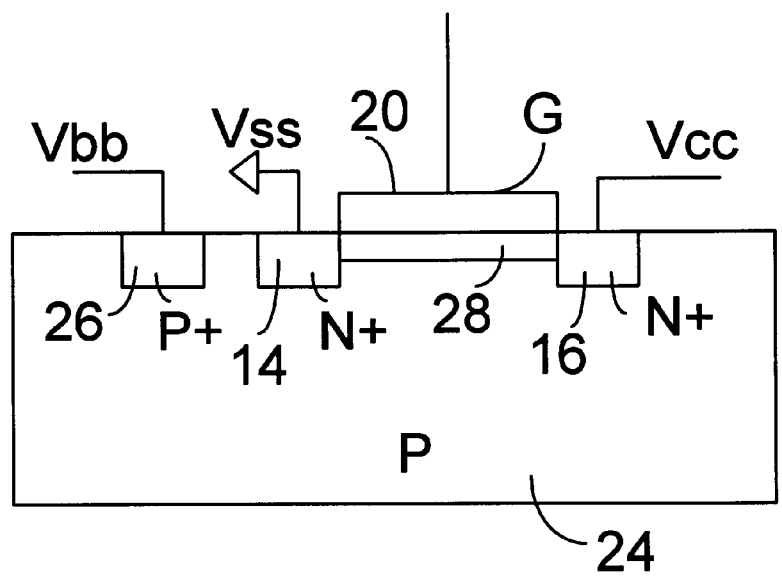
FIG. 2 is a schematic cross-sectional view of the transistor of FIG. 1.

Referring to FIGS. 1 and 2, a MOSFET transistor 10 includes a source 14 at a reference voltage Vss (which may be earth ground), a drain 16 receiving a source voltage Vcc (often called VDD), and a gate 20 receiving a gate voltage Vg. (In practice, there may be resistors, transistors or other elements between Vcc, Vss, Vg, and drain 14, source 16, and gate 20, respectively.) Gate 20 is an example of a control voltage port. If source 14 is at the reference voltage, the gate-to-source voltage Vgs equals the gate voltage Vg.

Transistor 10 is an iNOS or n-Channel transistor in which a body or substrate 24 is of a doped P type material, and source 14 and drain 16 are each of N+type material. A P+type tap 26 provides a path to body 24. When a gate voltage is applied, a channel 28 provides a path between the source and drain. Transistor 10 has a threshold voltage Vt that may be defined as the voltage applied between the gate and the source below which the drain-to-source current Ids drops to very close to zero. Transistors that are used in connection with the present invention are not limited to the particular details of transistor 10, which are provided only by way of example.

A body bias voltage Vbb is applied to body 24 through tap 26. (Vbb could be called Vbs for voltage of body to source.) When transistor 10 is in an active mode, the voltage Vbb is-such that a forward bias is applied to body 24 with Vbb being higher than Vss. The threshold voltage without a forward body bias is Vt(NFB). The threshold voltage with a forward bias is Vt(FB). In practice, Vt(FB) is lower than Vt(NFB) With a lower threshold voltage, transistor 10 can provide a greater drive current for a given Vgs. (The drive current is the maximum drain-to-source current Ids for a given maximum Vgs.) For example, transistor 10 in a forward body bias condition can provide the same drive current with a lower Vgs as compared to transistor 10 not in a forward bias condition. Likewise, transistor 10 in a forward bias condition can provide a greater drive current with the same Vgs and Vcc as compared to transistor 10 not in a forward bias condition. A forward bias leads to a lower threshold voltage Vt, an increase in drive current, and faster switching for a given Vgs, Vcc, and Vds.

Preferably, the amount of the forward body bias is less than or equal to the built-in potential Vpn of the pn-junction between body 24 and source 14. The built-in potential Vpn for silicon MOS transistors is about 0.7 volts. Vbb may be on the verge of full forward biasing but not be actually to full forward biasing. Merely as an example, and-not a limitation, the forward body bias could be about 500 millivolts for some embodiments of the invention.

In spite of its advantages, a forward body bias also has the tendency to increase leakage current of transistor 10, which is undesirable. During an active mode, the leakage may be tolerated because of the circuit speed benefits. However, during a standby mode of the transistor or circuit, when input signals are not being received and increased performance is not important, to avoid leakage, Vbb may be changed from a forward bias to a zero bias, a substantially zero bias, or a reverse bias. A "substantially zero bias" includes a range from a very small forward bias to a very small reverse bias, and significant leakage may occur during substantially zero bias. Leakage is much smaller or non-existent with a reverse bias condition. In some embodiments, the circuits are always in active mode while power is provided. In other embodiments, the circuits may be in an active or standby mode. For example, standby mode may include a low power mode in which the transistor bodies are, for example, zero biased, reverse biased, or less forward biased and Vcc and Vg remain the same. Standby mode may also include a sleep mode in which Vcc and Vg could be reduced (but if too low may lead to loses of data) and the bodies are, for example, zero biased, reverse biased, or less forward biased.

Figure 3:
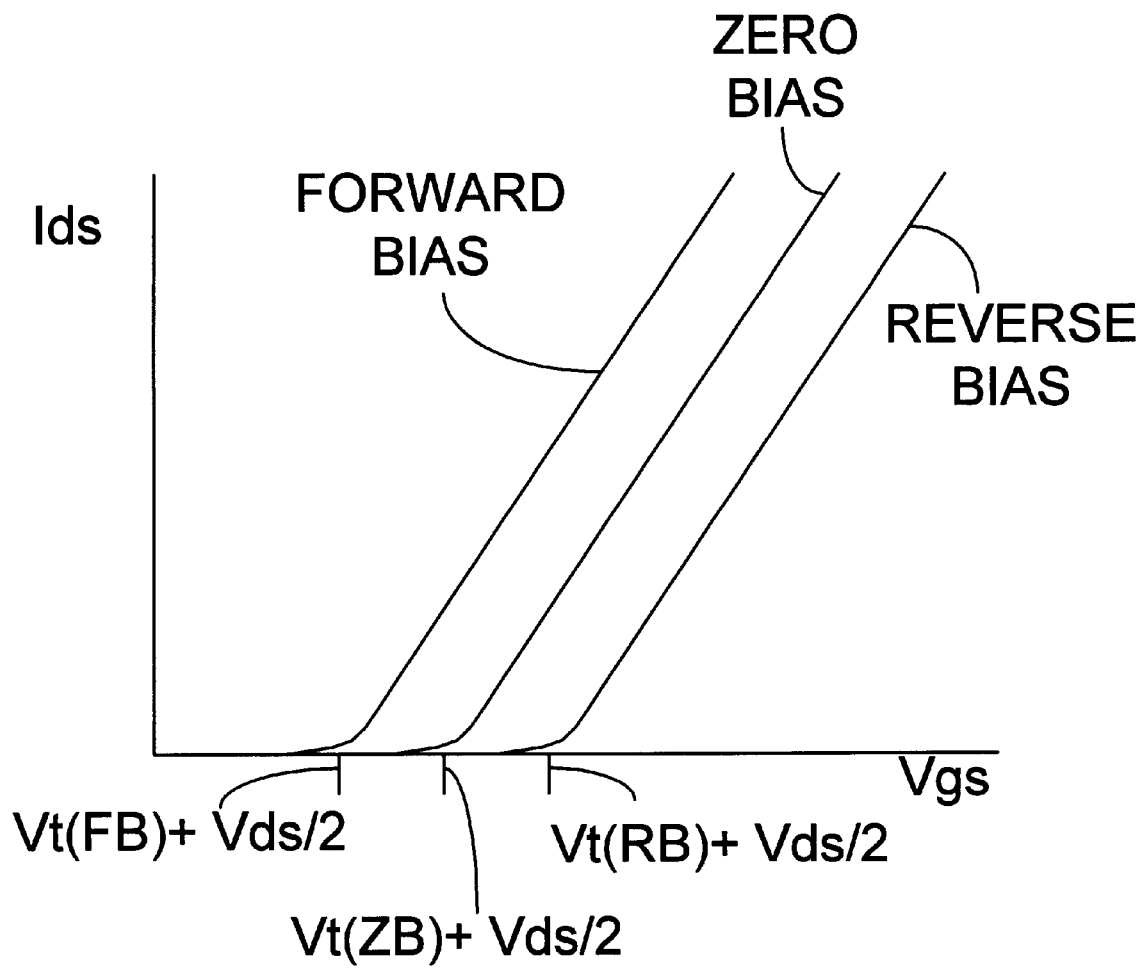
FIG. 3 is a graphical representation of drive current Ids vs. gate-to-source voltage Vgs for a forward bias, zero bias, and reverse bias in the transistor of FIG. 1.

FIG. 3 is a graph including three curves for drain-to-source current Ids as a function of gate-to-source voltage Vgs for a given drain-to-source voltage Vds. FIG. 3 includes Ids vs. Vgs curves for three different body bias conditions: a forward bias, zero bias, and a reverse bias. The threshold voltage Vt(FB) is the threshold voltage associated with the forward bias curve. The threshold voltage Vt(ZB) is the threshold voltage associated with the zero bias curve. The threshold voltage Vt(RB) is the threshold voltage associated with the reverse bias curve. The curves include a generally linear region and a non-linear region that approaches zero. There are three vertical lines that touch the Vgs axis. If the three linear regions continued so as to intersect the Vgs axis, the points of intersection would be at the points where the three vertical lines touch the Vgs axis. It is believed that theoretically, the linear portion of the forward bias curve would intersect at Vt(FB)+Vds/2. Theoretically, the linear portion of the zero bias curve would intersect at Vt(RB)+Vds/2. Theoretically, the linear portion of the reverse bias curve would intersect at Vt(RB)+Vds/2. As can be seen, the threshold voltage is smaller with a forward bias than with a zero bias or a reverse bias. Merely as an example, and not a limitation, Vds could be 50–100 millivolts for some embodiments of the invention. The graph of FIG. 3 is provided to illustrate the general effect of body biasing on threshold voltage and is not intended to be precisely accurate. Transistor according to the present invention are not required to have curves that have the appearance of those of FIG. 3.

B. Forward Body Bias from the Supply and Ground Voltage Nodes

Figure 4:
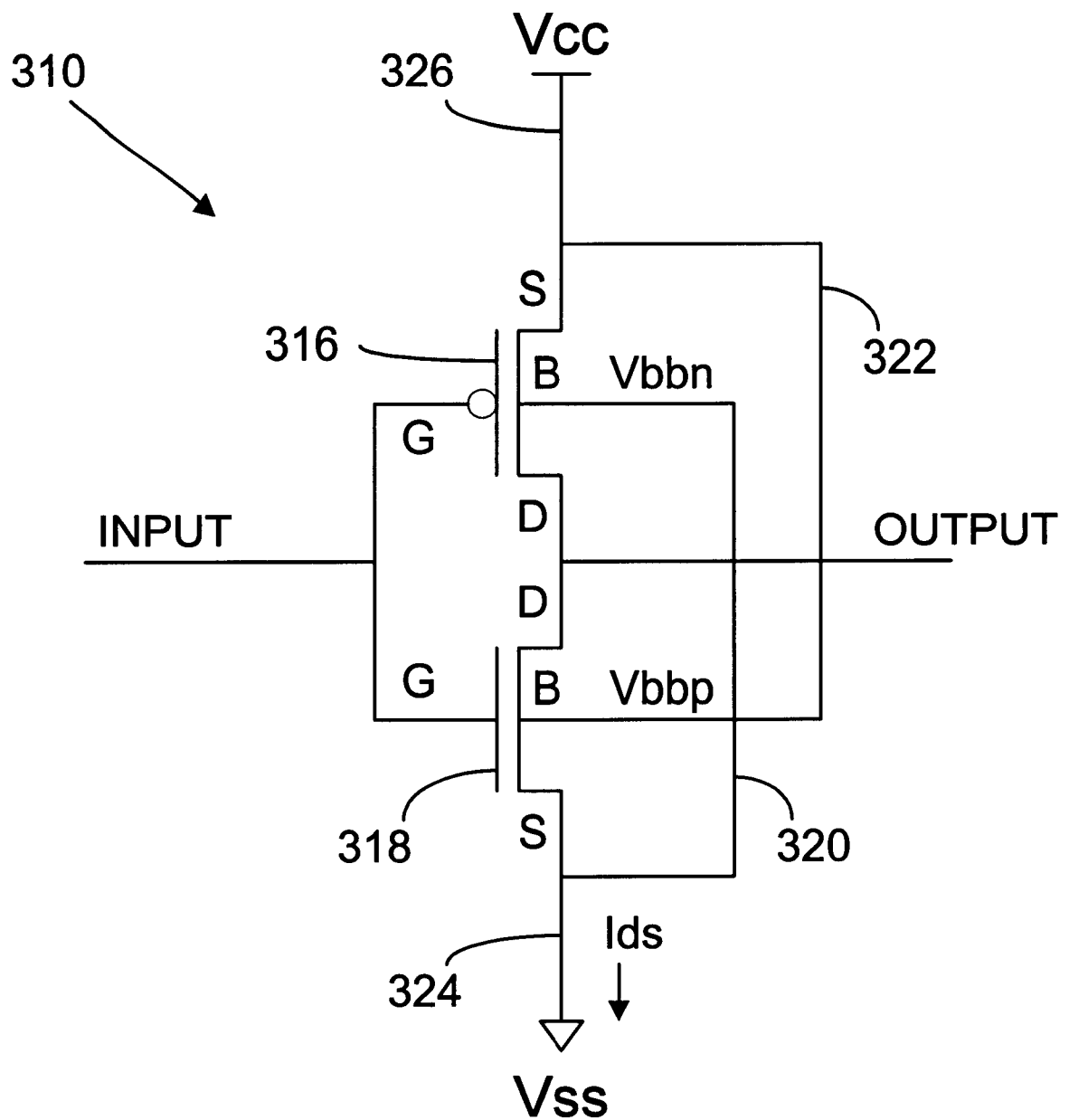
FIG. 4 is a schematic representation of an inverter circuit according to an embodiment of the invention.

Referring to FIG. 4, a circuit 310 includes a pMOS transistor 316 and an NMOS transistor 318, each having a gate (G), drain (D), source (S), and body (B). Circuit 310 is an inverter circuit with an input at the gates and an output at the drains of transistors 316 and 318. Circuit 310 includes a supply voltage node 326 providing supply voltage (e.g., Vcc often called VDD) and a ground voltage node 324 providing ground voltage (e.g., Vss). The nodes are not necessarily connected to pads or other ports on the surface of the die. The supply and ground voltage nodes are not necessarily at the same voltages as supply and ground voltage pads or other ports, respectively, on the surface of the die. The supply and ground voltage nodes may also be the supply and ground voltage nodes, respectively, for various other circuits.

A voltage Vbbn is the voltage of the n-type body of pMOS transistor 316. The body of pMOS transistor 316 is forward biased by making Vbbn<Vcc. More specifically, the body of pMOS transistor 316 is coupled to ground voltage node 324 through conductor 320. The forward body bias applied to the body of pMOS transistor 316 is Vcc−Vbbn=Vcc−Vss=Vcc.

A voltage Vbbp is the voltage of the p-type body of nMOS transistor 318. The body of nMOS transistor 318 is forward biased by making Vbbp>Vss. More specifically, the body of nMOS transistor 318 is coupled to supply voltage node 326 through conductor 322. The forward body bias applied to the body of nMOS transistor 318 is Vbbp−Vss=Vcc−Vss=Vcc.

Transistors 316 and 318 each have a threshold voltage Vt. The threshold voltages of transistors 316 and 318 are lowered because of the forward body bias. In an embodiment, Vcc is less than or equal to 700 millivolts, but may be higher. (If the forward body bias is greater than about 700 millivolts, there may be significant current between the source and body, which is generally undesirable.) For certain transistors and circuits, a Vcc of 450 to 500 millivolts may be optimal. However, higher or lower Vcc levels may be optimal depending on the transistors or circuits involved. Depending on an intended Vcc, the transistors may be designed to provide the desired Vt when the forward body bias is applied.

Figure 5:
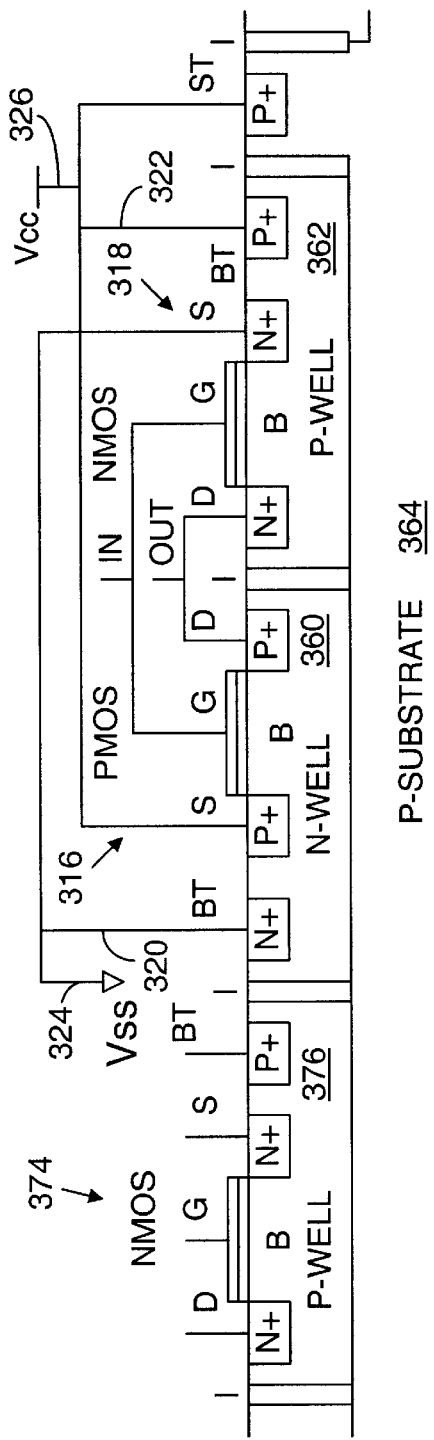
FIG. 5 is a schematic cross-sectional view of a portion of a semiconductor die in a twin well arrangement according to an embodiment of the invention.
Figure 11:
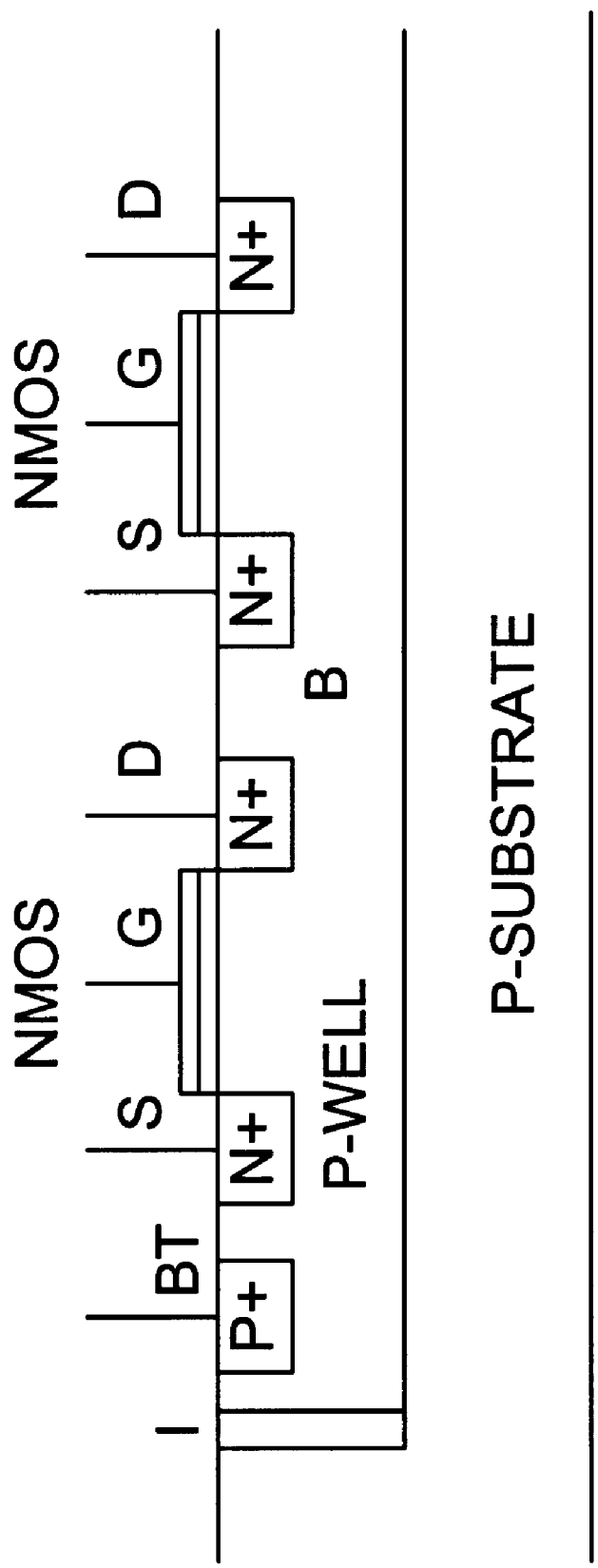
FIG. 11 is a schematic cross-sectional view of a portion of a semiconductor die showing multiple transistors in a well.

Referring to FIG. 5, merely as an example, a cross-sectional view of a die 370 implements circuit 310 of FIG. 4. In FIG. 5, pMOS transistor 316 is formed in an n-well 360 and nMOS transistor 318 is formed in a p-well 362 on a p-substrate 364 of die 370. A body B of transistor 316 is included in n-well 360, and a body B of transistor 318 is included in p-well 362. Die 370 also includes an nMOS transistor 374 having a body B included in a p-well 376. (There may be additional n-wells and/or p-wells. Also, various embodiments of the invention may be implemented with a die having only one n-well and only one p-well. A p-well is not required if there is a p-substrate.) There may be many transistors in each well. FIG. 11 illustrates two of multiple nMOS transistors formed in a p-well.

Referring to FIG. 5, a body tap BT of n-well 360 couples the body B of pMOS transistor 316 through a conductor 320 to ground voltage node 324. A body tap BT of p-well 362 couples the body B of nMOS transistor 318 through a conductor 322 to supply voltage node 326. NMOS transistor 374 also includes a body tap BT, but the bias applied to it is not known from FIG. 4. The body bias could be forward (when Vbbp is greater than Vss), reverse (when Vbbp is less than Vss), or zero (when Vbbp is equal to Vss). A substrate tap (ST) provides, for example, Vcc to p-substrate 364.

Lateral isolators (I)(also called trench isolators), such as oxide isolation, separate the wells. However, there may be a forward junction current between p-well 362 and n-well 360 through p-substrate 364. When Vcc (and the gate voltage) are relatively low, there is a relatively low drive current. The forward junction current can be significant relative to the drive current of pMOS transistor 316.

Figure 6:
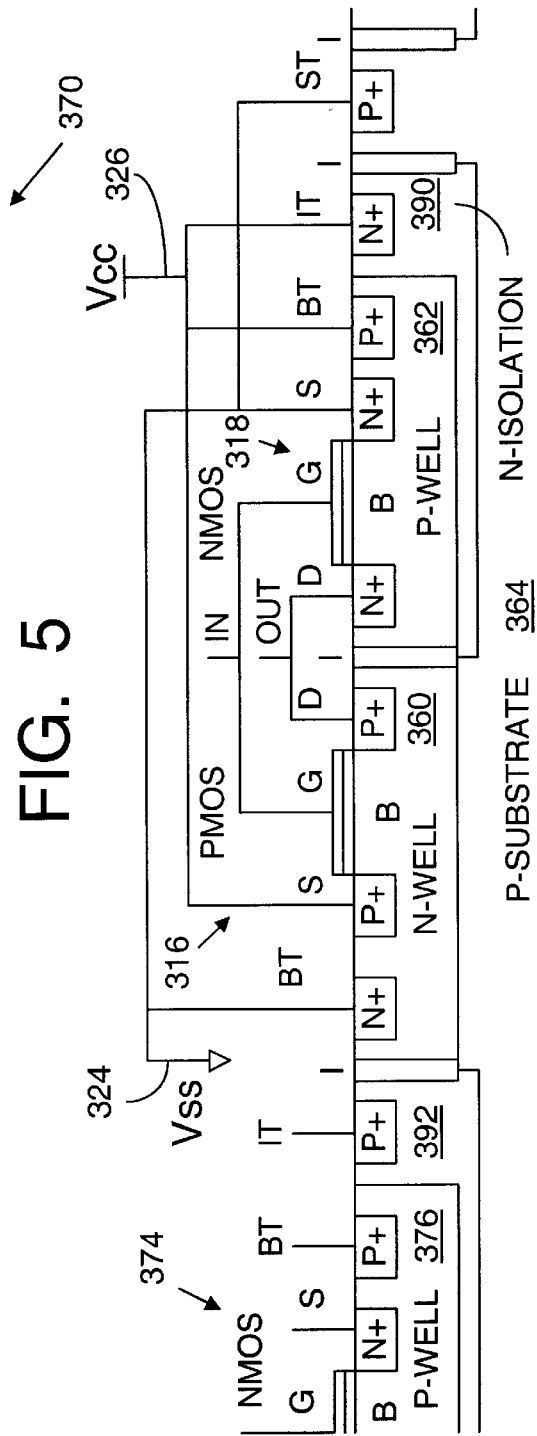
FIG. 6 is a schematic cross-sectional view of a portion of a semiconductor die in a triple well arrangement according to an embodiment of the invention.

As illustrated in FIG. 6, in a die 380, an n-isolation well or layer 390 may be formed between p-well 362 and p-substrate 364 to isolate at least p-well 360. N-isolation well 390 will prevent forward junction current between p-well 362 and n-well 360. In one embodiment, an isolation structure includes an n-isolation layer and one or more lateral isolators. An isolation tap (IT) couples n-isolation well 390 through a conductor to, for example, supply voltage node 326. The substrate tap (ST) may be couple to, for example, ground voltage node 324. Depending on how p-well 376 is biased, it may also provide a forward junction current to n-well 360. If so, an n-isolation well 392 may be formed between p-well 376 and p-substrate 364.

Alternatively, p-well 376 may be shorted to Vss or reverse body biased. In that case, n-isolation layer 390 would also isolate p-well 376 from p-well 362. (N-isolation well 392 might not be used if p-well 376 is shorted to Vss. N-isolation well 392 may be used if there are other p-wells or n-wells, not shown, having a different bias voltage.) The n-isolation layer(s) allows different wells to be selectively biased at different voltages and thereby provide different threshold voltages to transistors in different wells, similar to that shown in FIGS. 13 and 14. Using different body biases to obtain multiple threshold voltages may be significantly less costly than using different process techniques on different transistors.

As an alternative, if all the p-wells have the same bias, extra isolation could be given to the n-wells and the p-wells could be left not isolated.

Figure 7:
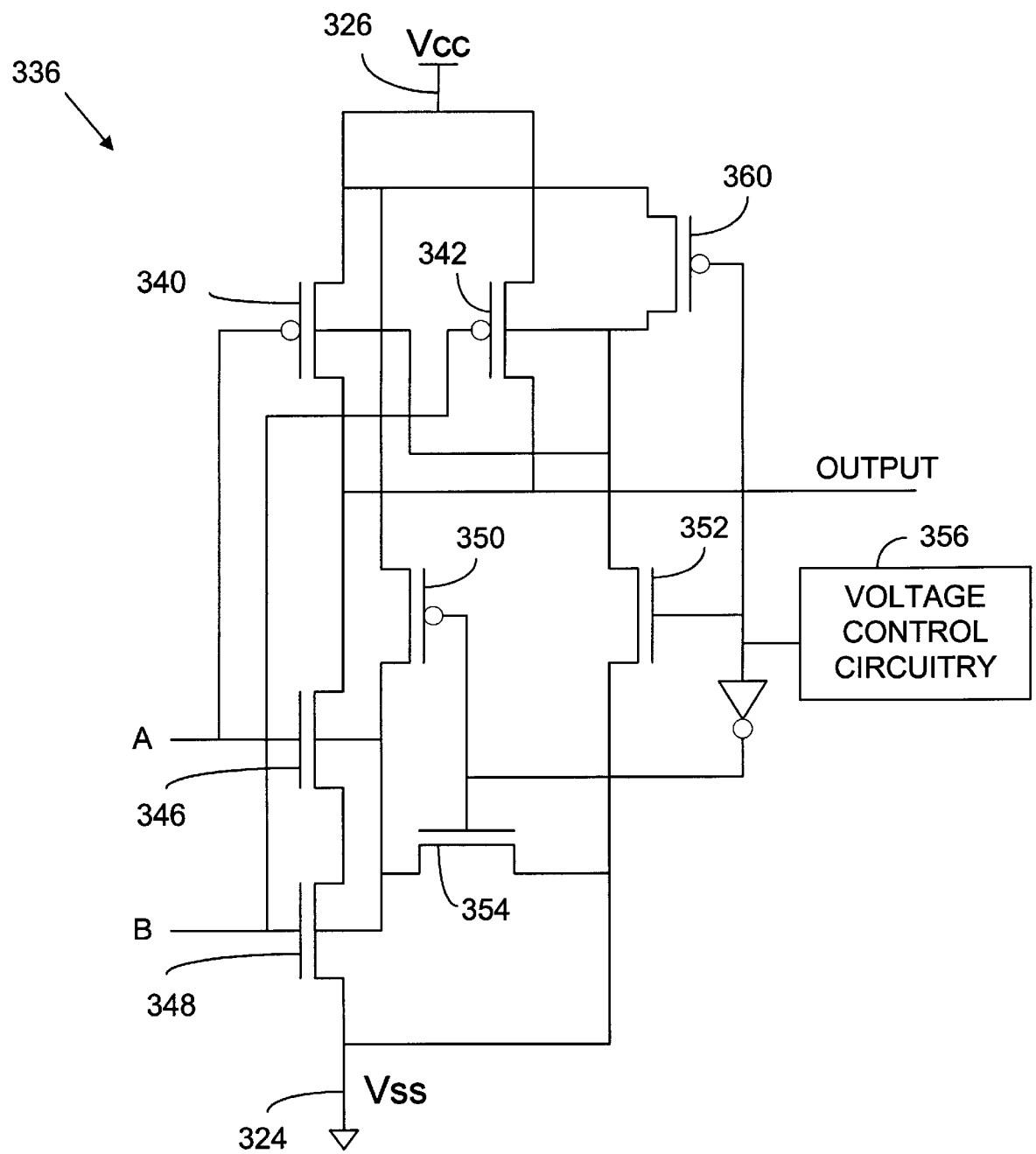
FIG. 7 is a schematic representation of a NAND circuit according to an embodiment of the invention.

FIG. 7 illustrates a NAND gate circuit 336 and further provides an example of how switches might be used to so that there are different body biases in active and standby modes. Voltage control circuitry 356 provides, for example, a logic high voltage in an active mode and a logic low voltage in a standby mode. In active mode, the bodies of pMOS transistors 340 and 342 are coupled to ground voltage node 324 through transistor 352, such that they each have a forward body bias of Vcc minus the voltage drop across transistor 352 (which voltage drop may be quite small). The bodies of nMOS transistors 346 and 348 are coupled to supply voltage node 326 through transistor 350, such that they each have a forward body bias of Vcc minus the voltage drop across transistor 350 (which voltage drop may be quite small). In standby mode, the bodies of pMOS transistors 340 and 342 are coupled to supply voltage node 326 through transistor 360, such that they are each biased by the voltage drop across transistor 360 (which voltage drop may be quite small). The bodies of nMOS transistors 346 and 348 are coupled to ground voltage node 324 through transistor 354, such that they are each biased by the voltage drop across transistor 350 (which voltage drop may be quite small). In standby mode, transistors 340, 342, 346, and 348 may be slightly forward biased or possibly substantially zero biased.

Figure 8:
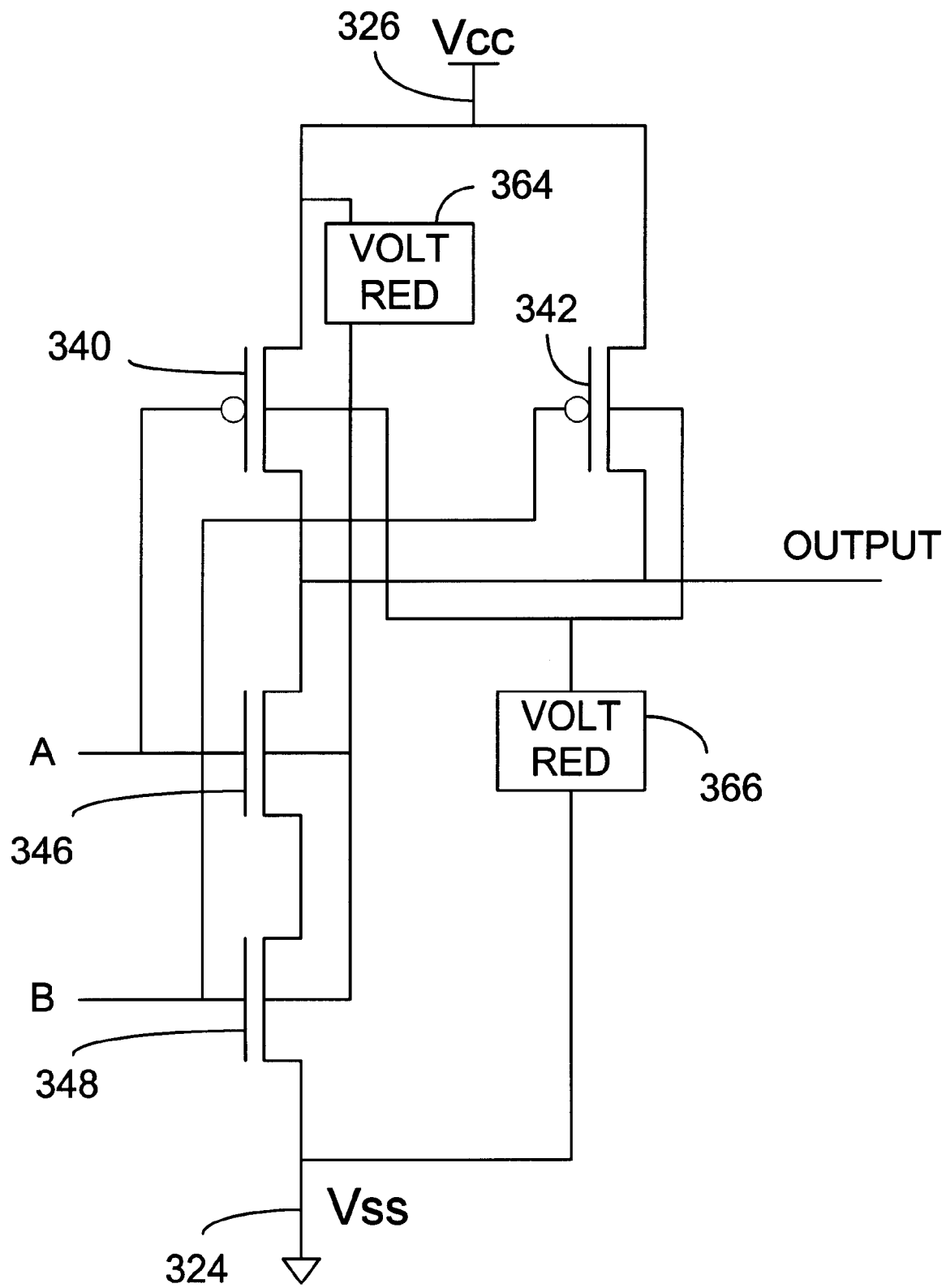
FIG. 8 is a schematic representation of a NAND circuit according to an embodiment of the invention.

FIG. 8 illustrates another NAND circuit in which Vcc is higher than would be desirable to bias the bodies of transistors 340, 342, 346, and 348 as they are in FIG. 4. In such a case, Vcc may be well above 0.7 volts. Voltage reduction circuit 364 reduces the voltage between Vcc and the nMOS bodies and voltage reduction circuitry 366 reduces the voltage between the pMOS bodies and Vss. The voltage reduction circuit could be voltage dividers (e.g., formed of transistors) or a transistor as in FIG. 7 (although the current may be so small that there would be little voltage drop between the source and drain of a transistor).

Figure 9:
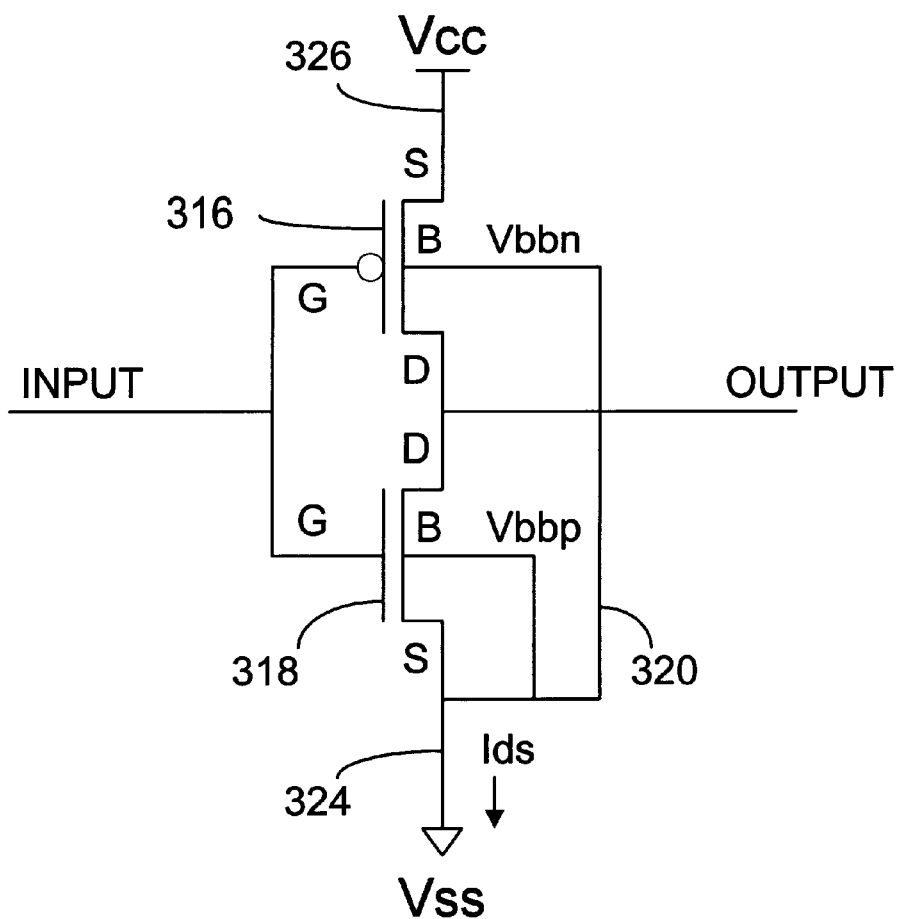
FIG. 9 is a schematic representation of an inverter circuit according to an embodiment of the invention.

FIG. 9 illustrates an embodiment of the invention in which only n-wells (for pMOS transistors) are forward body biased. Depending on the embodiment, doing so may eliminate the process step of forming the n-isolation layer. However, not all of the n-wells need to be forward biased. In another embodiment, only the p-wells (for the nMOS transistors) are forward body biased. Features of FIGS. 7 and 8 can be added to the circuit of FIG. 9.

A decoupling capacitor may be positioned between Vcc and Vss. There are also series capacitances from the natural pn diodes between Vcc and the body of the pMOS transistors, between the body of the pMOS and body of the nMOS transistor, and between the body of the nMOS transistor and Vcc. By contrast, in circuit 310 of FIG. 4, there are parallel capacitances from a natural pn junction diode between Vcc and the body of pMOS transistor 316 (which is at Vss), and a natural pn junction diode between Vss and the body of nMOS transistor 318 (which is at Vcc). The parallel capacitances are such that a lower decoupling capacitor may have to be added than if they the capacitances of the natural pn junction diodes were in series.

Figure 10:
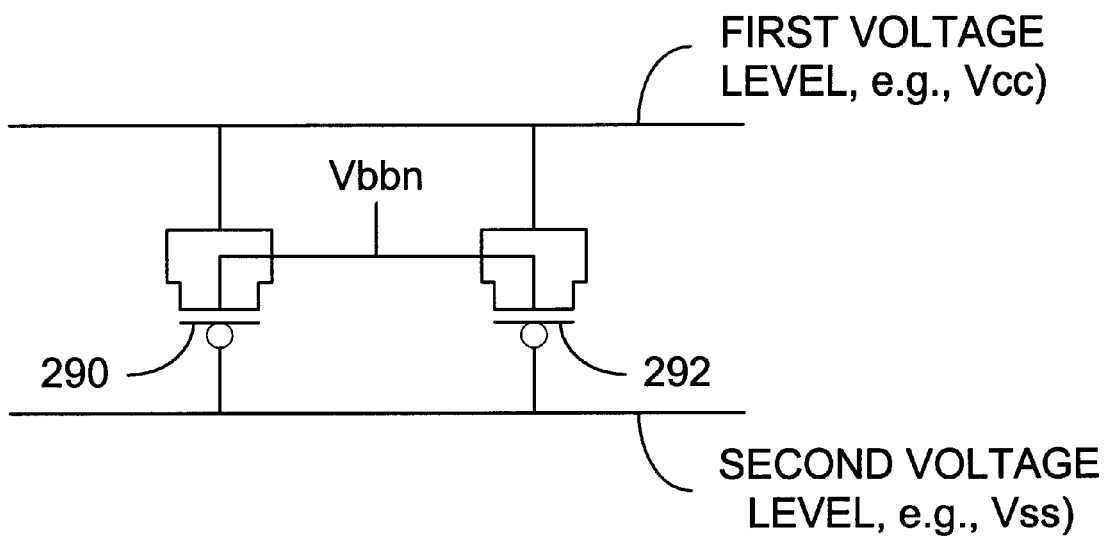
FIG. 10 is a schematic representation of forward biased decoupling transistors.

Referring to FIG. 10, forward body biased transistors 290 and 292 are used as decoupling capacitors between a first voltage level node (e.g., Vcc) and a second voltage level node (e.g., Vss) The voltage Vbbn may be provided from Vss or another voltage source such as a voltage bias generation circuitry. By providing forward body bias from Vss, for example, the capacitance increases and the size of the decoupling transistors does not have to be as large, or a greater capacitance is given for the same size as would otherwise be the case. By providing forward body bias from voltage bias generation circuitry, the increase in capacitance between Vcc and Vbbn will also provide decoupling capacitance between Vcc and Vbbn. In this latter example, Vbbn would be the second voltage level. A similar explanation holds for nFET transistors.

C. Multiple Vt Circuits

Relatively expensive process techniques have been used to provide different threshold voltages Vt to different transistors on a die. Preferred embodiments of the invention can eliminate additional masking steps and process complexities inevitable in a multiple-threshold-voltage process, and yield an assortment of n- and p-MOSFETs with varying degrees of leakage and drive currents on the same die at low cost There are at least two reasons why it may be desirable to apply different levels of body voltages to different transistors. First, applying a forward body bias may provide certain benefits such as increased switching speed and improved aspect ratio (explained below). However, it also increases leakage. For some circuits, such as those in a critical path where switching speed is important, the leakage can be tolerated. However, for other circuits, switching speed is not as important and the advantage of greater switching speed and improved aspect ratio does not justify the additional leakage. Second, there are certain circuits, such as at least some domino circuits where applying a forward body bias may degrade performance as well as increase leakage (which may degrade noise margin). Therefore, for many semiconductor circuits it would be desirable to have multiple body voltages to create multiple threshold voltages.

Figure 13:
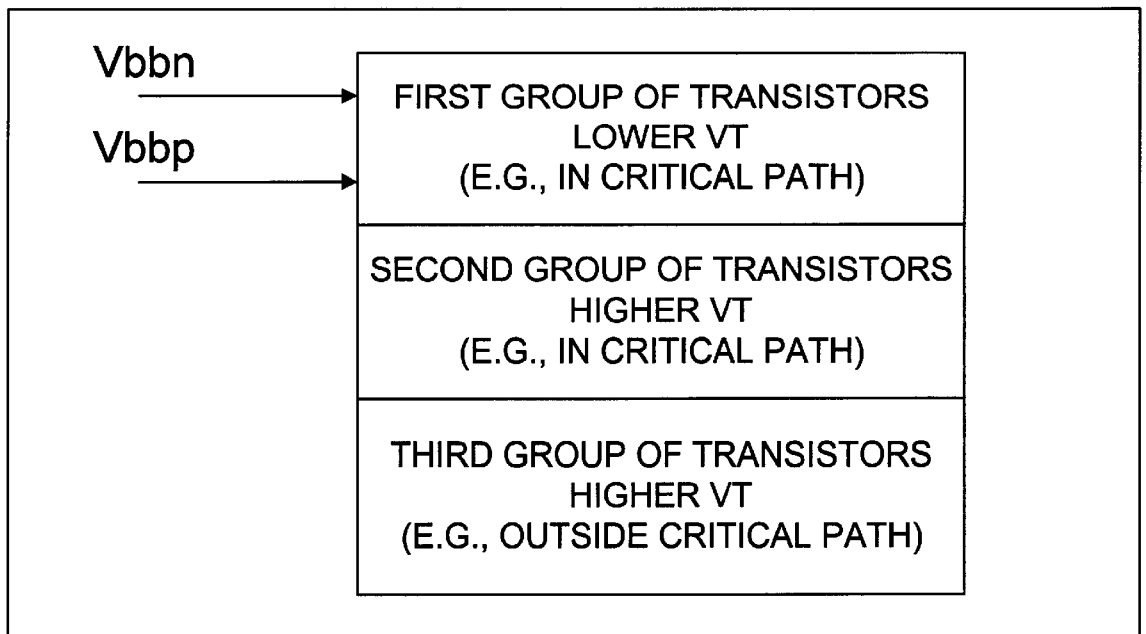
FIG. 13 is a block diagram representation illustrating multiple voltages applied to transistor bodies in a circuit.

As an example of a dual Vt circuit (which is an example of a multiple Vt circuit), referring to FIG. 13, a forward body bias is applied to a first group of transistors (e.g., in a critical switching speed path) such that the transistors have a lower Vt than those of a second and third group. The bodies of transistors of a second and third group are tied, for example, to their respective sources and have a higher Vt. The second group is in a critical speed path. However, transistors of the second group may be in circuits (e.g., certain domino circuits) for which forward body biasing is not desirable because it might degrade performance (e.g., through worse noise margin). The third group of transistors is not in a critical switching speed path and is not forward biased (either to reduce leakage or because the transistors are in circuits for which forward body biasing is undesirable for additional reasons). Accordingly, the transistors of the first group have different threshold voltages Vt than do the transistors of the second and third groups, without processing the transistors differently other than through perhaps a trace to a body tap. The transistors are in an electronic device die 204, which may be, for example, a microprocessor, memory device, or communication device, etc. The voltages applied to the bodies may be generated on or off the die.

Figure 14:
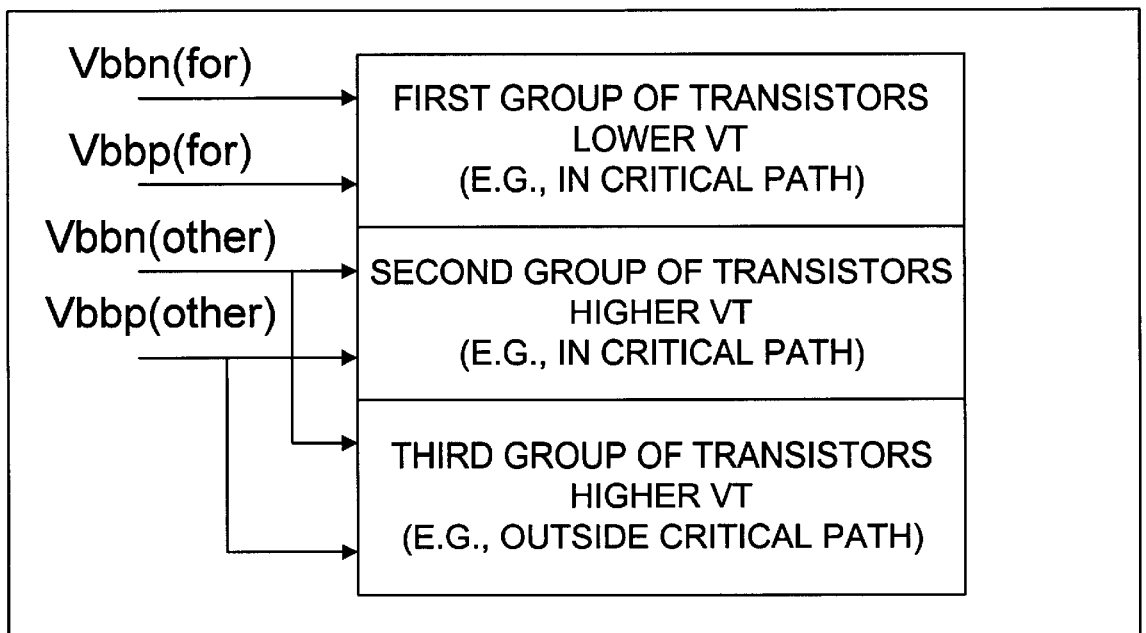
FIG. 14 is a block diagram representation illustrating multiple voltages applied to transistor bodies in a circuit.
Figure 15:
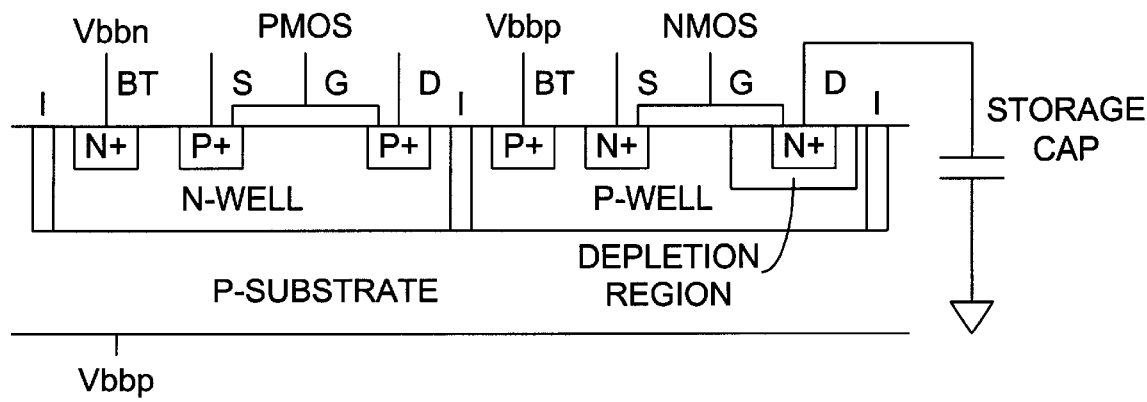
FIG. 15 is a schematic representation of a cross-section of a portion of a semiconductor die illustrating soft error rate reduction according to an embodiment of the invention.
Figure 16:
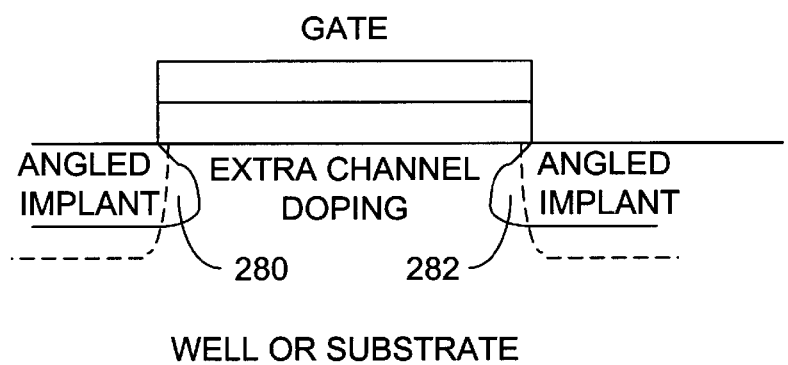
FIG. 16 is a schematic representation of a cross-section of a portion of a semiconductor die illustrating application of doping and angled implants.

Rather than tie the body to the source or drain, another bias may be applied to the body of the transistors of the second and/or third groups or a portion of the transistors therein. In FIG. 14, voltages Vbbn and Vbbp resulting in a forward body bias are applied to the first group of transistors (of course, this could be changed during a standby mode). Voltages Vbbn and Vbbp resulting in another bias (reverse bias, zero bias, or lesser forward bias) are applied to at least some of the second and third group of transistors. (Some of the second and third group of transistors could have their bodies tied to the respective source or drain, while others are lesser forward or reverse biased, in which case there could be at least three sets of threshold voltages Vt.) There may be more or less than three groups. The transistors are in an electronic device die 206, which may be, for example, a microprocessor, memory device, or communication device, etc. The voltages applied to the bodies may be generated on or off the die.

A factor to consider in determining how to allocate transistors between being high or low Vt transistors is the circuit's noise margin. Static CMOS circuits tend to have good noise margin and, therefore, tend to be able to tolerate lower Vts which may degrade noise margin to some extent. Some dynamic circuits, such as some domino circuits, have less noise margin and, therefore, may not be suitable for forward body bias.

In some embodiments of the invention, voltages Vbbp and Vbbn may be in a forward body biased condition even when the transistors are temporarily in the standby mode (e.g., when there are no A and B inputs to act on). Further, voltages Vbbp and Vbbn may be in a non-forward biased condition when the transistors are temporarily in the active mode (e.g., when there are A and B inputs to act on). One reason for doing so is that it may be desirable to not rapidly change the body bias voltage and to just keep a forward bias condition if the transistors will rapidly change between active and standby modes. Another reason for doing so is that the transistors may be part of larger circuitry and voltage control circuitry may provide body bias control to all the circuits. Accordingly, some of the transistors could be in a different mode from the transistors. This is discussed in greater detail with respect to FIG. 12 as follows.

Figure 12:
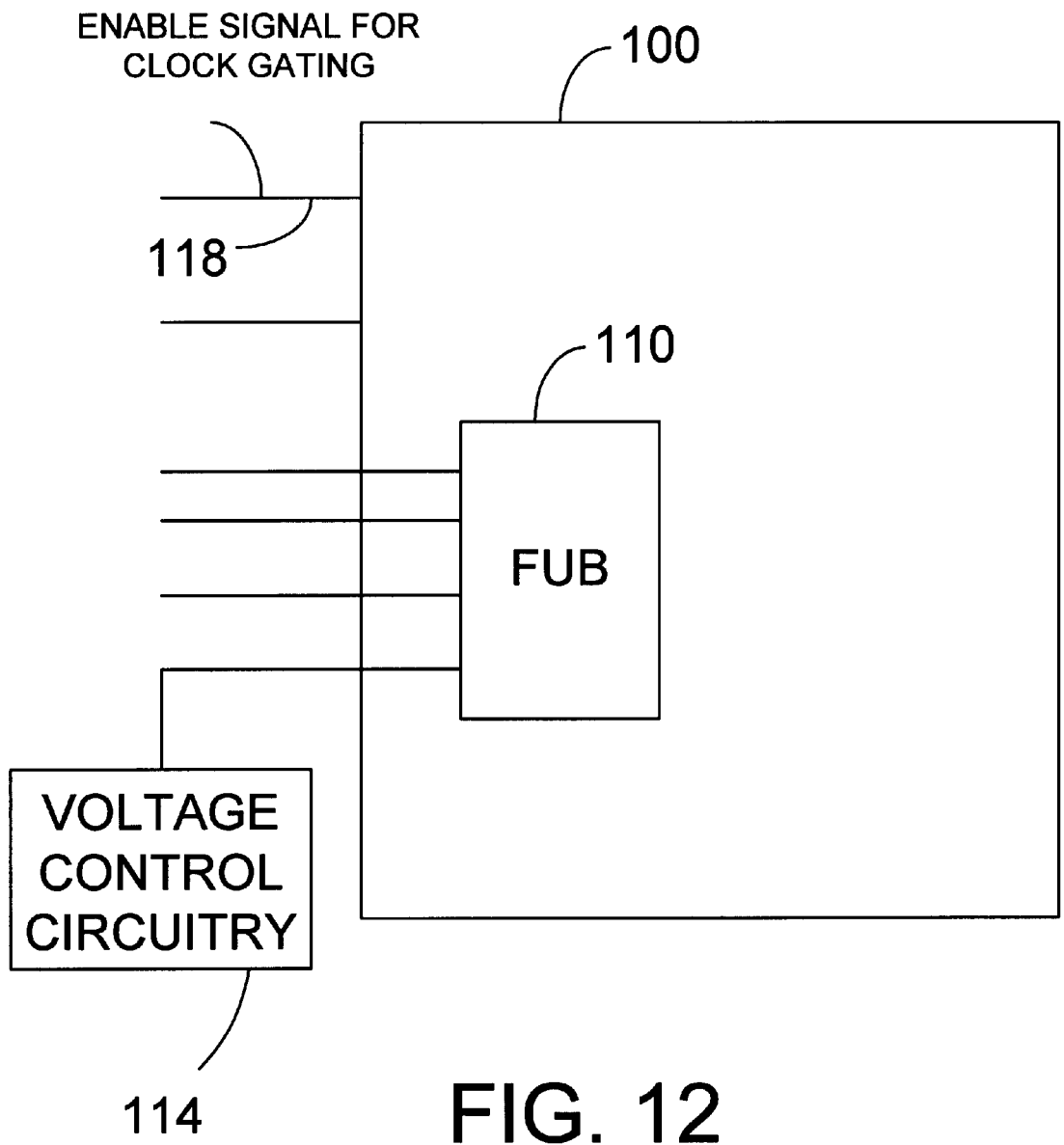
FIG. 12 is a block diagram representation of circuitry including a functional unit block (FUB) that selectively receives forward biasing according to an embodiment of the present invention.

FIG. 12 illustrates exemplary circuitry 100 that includes a FUB 110 that receives voltage control signals from voltage control circuitry 114 for numerous nMOS and nMOS circuits in a functional unit block (FUB) 110. Voltage control circuitry 114 determines a priori or simultaneously when FUB 110 will be in active mode and when it will be in standby mode. Voltage control circuitry 114 can make the a priori or simultaneous determination through various means. For example, the same circuitry that controls the applications of inputs to FUB 110 can also supply that information to voltage control circuitry 114 with advance or concurrent notice. It is possible that some transistors within FUB 110 will be in active mode, at the same time other transistors within FUB 110 will in standby mode. Voltage control circuitry 114 may follow certain rules in determining whether FUB 110 as a whole is in active or standby mode. For example, a rule could be that if 50% of the transistors are to be in the active mode, the entire FUB 110 is in active mode. Other rules could be used with different percentages. Also, voltage control circuitry 114 could ignore temporary conditions in which a large percentage of transistors are in standby mode. Rather than be concerned with the percentage of transistors, the rule could be to put voltages Vbbp and Vbbn in the forward body bias condition if any of the transistors in a group are in the active mode. Voltages Vbbp and Vbbn could remain in the forward body bias condition for at least a certain number of clock cycles. The rules could be flexible to balance speed and leakage. The enable signal for clock gating on conductor 118 could be supplied in connection with voltage control circuitry 114 or independently of voltage control circuitry 114 (cf. control circuitry 356 in FIG. 7).

It is not required that each transistor be in the forward or non-forward bias conditions at the same time. That is, some transistors may be forward body biased while other transistors are non-forward body biased.

Various embodiments of the present invention include static or quasi-static, limited and controlled forward body biasing of the body node of any/all pMOS or nMOS or both in any static/dynamic/differential MOS logic and memory circuitry implemented in bulk silicon. The term "static forward bias" means that the bias is constantly forward, regardless of whether the circuits are in active or standby modes. The term "quasi-static" means a forward body bias is applied during only a portion of the time, while a zero bias, substantially zero bias or reverse bias is applied during some other times. The bias voltage can be generated and distributed from a voltage source either on-chip or off-chip. Forward-biasing of different n-wells and p-wells by different amounts can be used to generate an assortment of n- and p-MOSFETs with varying degrees of leakage and drive currents on the same die.

D. Soft Error Rate (SER)

Soft errors are changes in the state held by a transistor or circuit node caused by ionizing radiation, such as alpha particles and cosmic rays, striking a transistor or circuit node. The change in state may be from a high to low or low to high voltage. It is believed that soft errors occur as a result of charge (electron hole pairs) generation by ionizing radiation. The generated charge interacts with the desired charge stored on nodes and circuits, hence creating an error. Capacitance $C=A\epsilon/D$, where A is the area and D is the distance between the different voltages plates. Charge $Q=CV$, where C is the capacitance and V is the voltage (e.g., Vcc). Soft errors will become more likely as the dimensions (A) of transistors decreases and/or as Vcc decreases (voltage scaling) resulting in a smaller amount of charge held by the capacitor (a node). It is believed that forward body bias reduces soft error rate (SER) by reducing the junction depletion volume (making a smaller target for a strike of ionized radiation) and increasing node storage capacitance (by decreasing the depletion region distance D). As the node storage capacitance increases, the node's critical charge is larger. It is believed, therefore, that radiation must have a higher charge to upset the charge stored on a node having forward body bias. For example, referring to FIG. 21, a nMOS transistor and a storage capacitor are used in a memory cell. A depletion region around the drain collects minority carriers. If the charge is collected in a smaller area, it is less likely to be struck by radiation and the cell is more likely to hold its charge if it is hit by radiation because the smaller depletion region has a larger junction capacitance.

It is believed that the following are additional reasons why applying a forward body bias may improve SER. The forward bias junction diode (e.g., between source and body) can assist recovery of a node after a strike. Applying a forward body bias lowers Vt leading to a higher transistor drive current (e.g., IDSAT). If drive current is higher, it is more likely that a transistor can replenish upset charge faster making it less likely that the charge will be lost altogether. In addition, the weak parasitic bipolar action from the source side with forward body bias may affect existing minority carrier flow in the well which may improve SER.

There is a natural capacitance at the drain output of a FET. In FIG. 21, the storage capacitor is illustrated schematically as being a separate capacitor. For a memory devices such as a DRAM, the capacitance may be trench capacitance or stacked gate capacitors.

An isolated p-well (e.g., as in triple well described above) creates a natural barrier to electron hole pairs. Multiple/triple well technology can improve SER by pn junctions formed between the body of the device and its corresponding isolation well. The junctions create a natural barrier to minority carriers produced by ionizing radiation which has penetrated deep into the silicon (creating electron hole pairs underneath the wells). In effect, both pMOS and nMOS transistors will have equal protection by pn junctions and both are isolated from the substrate by a pn-junction well using a multiple/triple well technology.

Forward body bias combined with triple well technology improves SER even more because they combine the improvements offered by either one of the techniques offered separately.

The level of forward body bias to apply to achieve good SER reduction may vary significantly depending on various factors. It may be that the level of forward body bias will be higher or lower than the level to apply for good performance or power consumption levels. With certain circuits and temperatures (e.g., 110° C.), percent increase in switching speed increases as the forward body bias increases from 0 to an inflection point or region and then begins to decreases as the forward body bias further increases past the inflection point or region. For a temperature of about 110° C., for some circuits, the inflection point or region may be about 500 millivolts forward body bias for a range of Vcc/Vt ratios of 4.5, 3.5, and 3. It may be that a forward body bias of 400 to 500 millivolts is optimal. These values are temperature dependent because the inflection point or range varies with temperature changes. Depending on various factors, there may be a similar curve for SER wherein SER improves as forward body bias increases until an inflection point or region following which SER gets worse as forward body bias increases. However, the inflection point or region of forward body bias at which SER improvement is optimal may be less or greater than would be acceptable for other reasons (e.g., when the forward body bias exceeds the built-in potential also called diode turn-on voltage or the contact potential or offset voltage of around 0.6 to 0.7 volts). The amount of forward body bias for maximum immunity to SER may be lower or higher than optimal value for performance (e.g., 500 millivolts).

E. Other Advantages of Forward Body Bias

The switching speed of a transistor or circuit (low voltage to high voltage or high voltage to low voltage) is related to the ratio of supply voltage to threshold voltage or Vcc/Vt. If the ratio is too low, the switching speed may not be sufficient for a particular use and the noise margin may also be affected. However, for example, if the ratio is high by maintaining Vcc and decreasing the threshold voltage Vt, the speed may be high with well controlled active power, but the static power consumption may be unacceptably high due to high leakage at low Vt. Further, if Vcc is too high, the active power will be high and the electrical field E may be too high for the dimensions of the transistors, leading to reliability failure of the transistors. In many situations it is desirable that the both Vcc and Vt be lowered by roughly comparable amounts for aggressive voltage and technology scaling.

It is difficult and costly to lower Vt through process techniques (and design), although over the years improvements in process techniques have been used to lower Vt and it is expected that improvement in process techniques and design will continue to lower Vt. With the application of forward body bias, transistors have a lower Vt than would otherwise would be available through existing process techniques and design or possibly those developed in the future. Hence, embodiments of the invention provide a low cost solution for achieving low Vt transistors with improved short channel effects which is contrary to the trend of process/technology created low Vt transistors through channel engineering. Forward body bias provides a means to control the Vcc/Vt ratio by controlling Vt for various applications such as high performance/high power or moderate performance/low power circuits.

1. Short Channel Effect (SCE)

Short channel effect (SCE) is the phenomenon by which the gate does not have good control over the channel region. It is believed that application of a forward body bias reduces short channel effects such as Vt roll-off, IOFF roll-up (IOFF vs. L (channel length)), and DIBL. SCE may be a critical limitation in developing future technologies with low Vt transistors. SCE can be visualized by looking at the change in Vt as a function of channel length (dVt/dL). It can be costly to develop transistors meeting performance and power specifications because of degradation of SCE for advanced devices. By improving SCE, forward body bias enables transistors with low Vt and good SCE. Consequently, forward body bias helps introduce more aggressive technologies and a low cost capability to scale Vcc along with Vt.

2. Aspect Ratio

The aspect ratio of a MOSFET is a known measure of SCE and is defined in equation (1) below:

$$\text{Aspect ratio}=\text{Leff}/\text{Deff}=\text{Leff}/(\text{Tox D Xj})^{1/3} \quad (1),$$

where Leff is an effective channel length between source and drain, Tox is the thickness of the gate oxide between the gate and silicon, D is the depth of the channel depletion region, and Xj is the junction depth of the source and drain. It is believed that application of a forward body bias increases the aspect ratio by decreasing the depletion region. Those transistors intended for forward body bias may have a smaller channel depletion region depth (D) because there may be manufactured with a higher Vt at zero bias. These higher Vt transistors may have a higher channel doping and hence a lower channel depletion depth. In many if not all situations, it is significantly less costly to obtain a low Vt through applying a forward body bias than through other process techniques such as those involving channel engineering. As the aspect ratio increases, the ID v. VDS curves of transistors may become flatter in least in part because of a lower DIBL and hence a lower SCE.

Smaller short-channel effects may facilitate flattening the Vt roll-off vs. L curve, decreasing DIBL, reducing target Leff, increasing IDSAT at the target Leff, improving delay for target IDSAT (Ids v. Vds curve), and reducing parameter variations by improving sensitivity of Vt to L. Note that L tracks Leff, so that either L or Leff could be mentioned.

3. Parameter Variations

The application of forward body bias can reduce the effects of variations in transistor parameters (parameter variations). Forward body bias improves device parameter variation critical for developing small dimension transistors for scaled power supply voltage technologies. Forward body bias applied to transistors may improve the sensitivity of threshold voltage to transistor channel length variation (i.e., smaller rate of Vt change with L variation). Consequently, a device can tolerate more parameter variation. Examples of device parameters improved with forward body bias are: Vt, IOFF, and IDSAT. With improved parameter variation, critical dimension (CD) control may not need to be as tightly managed and it may not have to scale with technology generation or be less of a scaling factor. Relaxed CD control will allow faster deployment of next generation process technology. This relieves pressure from lithography and design to provide, for example, lower 3-sigma CD control and products that are not as CD sensitive. Furthermore, as sensitivity to parameter variation improves, a technology becomes more manufacturable and more cost effective.

4. Other effects

The application of forward body bias may reduce jitter because with a small Vt, variations in Vcc or Vss are less of an impact on transistor drive current Id and hence delay.

Applying a forward body bias may improve saturation drain conductance, which may be an important parameter for circuit gain.

Applying a forward body bias may achieve results in addressing the above-described problems at lower cost that through process techniques such as doping. Further, a forward body bias may achieve results that might not be attainable through process techniques alone.

F. Process of Manufacturing and Structure of Some Preferred Transistors

The following describes processes of manufacturing and structure of certain preferred transistors. However, various embodiments of the invention may be implemented with other transistors manufactured by other processes and with other structure.

A desired low Vt with forward body bias is selected. A value of forward body bias is selected. It is determined how much a drop in Vt will occur because of the forward body bias. (Alternatively, the Vt at zero bias is selected and then it is determined what forward body bias will give the desired low Vt at the forward body bias.) Transistors are designed and processed to have a Vt at zero bias which when lowered by forward body bias will have the desired low Vt. If forward body bias is applied to both nMOS and pMOS transistors, all nMOS transistors are designed and processed the same and all pMOS transistors are designed and processed the same. Those transistors for which forward body bias is not applied will have a slower switching speed (since they have a higher Vt) than those for which forward body bias is applied, but will have lower leakage and, therefore, lower static power consumption. Note that some transistors could be reverse biased in active and/or static mode. Referring to FIGS. 9 and 10, there may be more than two Vts while the transistors are in active mode. There are some tradeoffs in choosing the Vts with zero body bias knowing that a forward body bias is applied that lowers the Vt to a final desired value. However, the transistors should be designed and processed so that Vt with zero bias is such that each transistor has acceptable speed and active and static power consumption. This provides a process design that may be easier and less costly to achieve because the channel doping can remain high.

The transistors have zero body bias threshold voltages (even if the transistors do not have a zero body bias in operation). The transistors have a forward body bias threshold voltage (VtFBB) when the transistors are forward body biased. The transistors have parameters including a net channel doping level (e.g., equal to DL1). In one embodiment, DL1 is selected to be higher than a net channel doping level in the transistors that would result in a zero body bias threshold voltage equal to VtFBB, with the parameters other than the net channel doping level being unchanged. Although various amounts of extra doping in the channel and doping of the angled implants may be used, the net effect of the extra channel doping and doping of the angled implants may be a net channel doping that is about 100% (or 2 times) or more higher than that which would provide a zero bias threshold voltage. In other embodiments, the net doping may be substantially less than 100% higher (e.g., at least 25% higher, 50% higher, or 75% higher).

The amounts of extra channel doping and angled implants may be the same for pMOS and nMOS transistors (although the charge will be different), or the amounts may be different for pMOS and nMOS transistors.

If a forward body bias is applied to only pMOS transistors or to only nMOS transistors, the Vt without a forward body bias is chosen such that each transistor has acceptable speed and active and static power consumption.

Tradeoffs may be made in deciding what the optimal Vt should be without forward body bias being applied. Factors to consider may include: (1) the number of transistors to which forward body bias will be applied versus the number of transistors to which forward body bias will not be applied; (2) how important switching speed is for both groups of transistors; (3) how important power consumption is to both groups of transistors; (4) the Vcc that is suitable for the transistors; (5) and cost savings in fabricating transistors with higher Vt at zero body bias and a lower Vt with forward body biasing.

The transistors could be designed and processed differently to have different Vts with zero body bias. However, this can be significantly more expensive than have all nMOS transistors designed and processed the same and all pMOS transistors designed and processed the same. There may be a need for extra masks and implants.

It is believed that the techniques in manufacturing process technology that lead to a high Vt, also tend to lead to lower SCE (because of higher channel doping), and applying a forward body bias further improves SCE. Therefore, designing a transistor with higher Vt at zero body bias and then reducing the Vt by forward body bias may give a double benefit in SCE. Further, it may be significantly less expensive to manufacture transistors with higher Vt than transistors with lower Vt.

There are various channel, well, and source/drain engineering ways to produce transistors having a desired Vt, e.g., a higher Vt. One way is to not do additional steps (e.g., masking steps) that lead to a lower Vt. Another way is to have greater channel doping than with transistors having lower Vt. This can be accomplished in a two step process by first doping the well and then doping the channel as a separate step or by a single step process of doping the channel as part of the well doping process. (Note that it is not required that there be wells for both pMOS and nMOS transistors.) By engineering the channel, e.g., increasing the channel doping, the D in the aspect ratio equation is reduced and then aspect ratio improves leading to better short channel effects.

Many parameters can impact SCE including Tox, xj, L, Vcc, channel (including well and substrate), and source/drain (including any portions of angled implants). One or more of these transistors are designed and processed for the transistors to have low SCE. A process technique that may be used is to perform ion implementation at an angle (other than perpendicular) with respect to the die surface. This is called angled implants and may effect the net amount of channel doping, which is a function of channel length. Examples of the implants include boron, phosphorus, and arsenic, which are implanted into the sides of the channel region around source and drain edges to improve SCE. The gate blocks part of the implants leading to a halo effect. Angle implants are also referred to as halo implants or pocket implants. For example, FIG. 22 schematically illustrates general areas of extra channel doping and angle implants. Sources and drains may be added before or after the angle implants. Possible locations of source and drains are shown in dashed lines. Angled implant sections 280 and 282 are between the source and drains at the edges of the channel. Angled implants are examples of roll off compensation implants. Other roll off compensation implants may be used. The channel may include at least a portion of the angled implants.

A transistor may have differently designed channel doping and/or angled implants with forward body biasing as higher channel doping was mentioned above. Other techniques in place of or addition to these may be used to achieve desired Vts and/or SCE.

G. Additional Information

While the illustrated embodiments have been described with regard to MOSFET transistors, the invention is not limited in this respect. For example, the invention may be implemented with field effect transistors (FET transistors) that are not MOSFET transistors, because for example they do not include an insulator (often called an oxide gate). Of course, a MOSFET transistor is an example of a FET transistor. Also, the term MOSFET is sometimes used to refer to transistors which have a non-metal gate and a non-oxide insulator. (Although the term "transistor" is redundant in "FET transistor" it is used as a matter of style.) FET transistors may have a p-channel (pFET transistor) and n-channel (nFET transistor).

For many applications, a Vcc of about 0.9 volts or less may be optimal for a latch up or active power view point. There may be significant problems with latch up with a Vcc of around 2.0 volts or even less. Merely as an example, Vcc may be around 500 millivolts in sub-100 nm Leff with Vcc/Vt>4 for gate overdrive. Vcc/Vt may be less than 4.

A forward body bias of 500 millivolts may be lower than linear Vt by, for example, less than or equal to 100 millivolts to 150 millivolts and may improve the sensitivity of Vt to Leff, measured as change in Vt over change in L.

The Vt values used in sub-1V, sub 100 nm Leff, high-performance technology may be relatively small. Accordingly, a larger subthreshold swing is not expected to impact the leakage current significantly. Minimizing IOFF-increase with transistor channel length L variation can be increasingly critical in low-Vt technologies for achieving the largest drive current subject to 1) a maximum worst-case leakage current constraint and 2) a specific amount of L-control. Furthermore, if the junction capacitance is a small fraction of the total load capacitance, then the drive current increase can translate directly into higher operating clock frequency.

In those cases in which dual Vt is used, a difference of about 100 millivolts in the two Vts may lead to lowest power consumption, although it is not necessarily the best for switching speed performance.

Through parameter variations, threshold voltages Vt are typically not equal across a wafer or die. Dynamic forward body bias feedback may be used to make the threshold voltages equal.

The present invention may be used in low-cost, high-performance, and low-power microprocessor and communication chips in, for example, sub-0.18 micrometer technology generations. The invention provides a means of providing leakier, higher-performance MOSFETs on the same die that contains low-leakage, lower performance transistors through affordable process technology. This helps with the noise-immunity requirements of dynamic CMOS logic and memory circuits. Accordingly, the invention can potentially eliminate additional masking steps and process complexities inevitable in a multiple-threshold-voltage process and provide a low-cost alternative to design and manufacture of future high-performance/low-power microprocessors and communication chips.

As examples, the present invention may be applied to all or selected nMOS/pMOS devices in (1) conventional static CMOS logic and memory circuits, (2) all varieties of dynamic or differential CMOS logic circuits (e.g. Domino, D1/D2 Domino, self-resetting (SR)-Domino, Zipper, Dual-Rail Domino, cascade voltage switch logic (CVSL), cascade differential nMOS logic (CDNL), etc.) and (3) pass transistors, resident in clock drivers/receivers, latches/flip-flops, control logic datapath logic, I/O drivers/receivers etc., each of which may be used inside or in connection with a microprocessor. The present invention may provide significant speed improvements compared to present technology. In particular, the following nMOS/pMOS devices may benefit from the invention: (1) transistors in static CMOS gates resident in critical paths, (2) clocked transistors in gated or untagged clock drivers, (3) clocked transistors in domino logic, and (4) transistors in a static receiver logic stage at the output of a domino gate.

In preferred embodiments of the invention applied to all or selected nMOS/pMOS devices in the aforementioned circuits, the invention may enable ultra-aggressive scaling of supply voltage in selected portions of all parts of a chip without incurring any speed penalty, and thus may provide significant reductions in active power consumption at a desired performance level set by the process technology.

Preferred embodiments of the invention may alleviate signal swing degradation across non-complementary pass transistors. Preferred embodiments may significantly improve the device parameters control on a die (by improving the SCE/DIBL/PT characteristics of MOSFETs) which may be a key limiter to both performance enhancement and supply voltage scaling for lower power.

As is known, IDDQ (leakage testing) is measured in testing to ensure quality and reliability by screening potentially defective dice. If the leakage is too high because of a low threshold voltage, it may be difficult to gather useful information from IDDQ. In testing and burn-in, the forward body bias mode may be disabled and a non-forward body bias (e.g., a reverse body bias, a zero body bias, or a less forward bias) may be applied. In that case, the threshold voltage will be higher leading to lower leakage and better testability and quality through the IDDQ testing.

Throttling may be used by an operating system (or other software or hardware) in opportunistically establishing when to use active versus standby mode to, for example, reduce power consumption.

The various structures of the present invention may be implemented according to any of various materials and methods known to those skilled in the art. There may be intermediate structure (such as a buffer or resistor) or signals that are between two illustrated structures. Some conductors may not be continuous as illustrated, but rather be broken up by intermediate structure. The borders of the boxes in the figures are for illustrative purposes. An actual device would not have to include such defined boundaries. The relative size of the illustrated components is not to suggest actual relative sizes.

The figures are schematic in nature and not intended to be exact representations of, for example, cross-sections. For ease of illustration, various well known features of the transistors are not illustrated in some of the cross-section representations. Arrangements other than those illustrated could be used. For example, an n-substrate could be used. If a p-substrate is used, a p-well is not required. If a n-substrate is used, an n-well is not required. Further, different embodiments of the invention may have somewhat different details. The particular location and order of source (S), drain (D), body tap (BT), substrate tap (ST), and isolation tap (IT) are made for convenience of illustration and may be the same or somewhat different in different embodiments.

In the specification and drawings, reference or illustration of a "conductor" could include a single conductor or parallel conductors carrying signals.

The term "connected" and related terms are used in an operational sense and are not necessarily limited to a direct connection. If the specification states a component "may", "can", "could", or is "preferred" to be included or have a characteristic, that particular component is not required to be included or have the characteristic.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A semiconductor circuit, comprising:
  a ground voltage node to provide a ground voltage; and
  p-channel field effect transistors (pFET transistors) in transistor configurations in the circuit, the pFET transistors having an n-type body electrically coupled to the ground voltage node to forward body bias the pFET transistors, wherein the n-type body and ground voltage node are coupled through a conductor extending continuously from an interface to the n-type body to the ground voltage node such that the n-type body is at the ground voltage.

2. The circuit of claim 1, wherein the interface includes a tap to the n-type body.

3. The circuit of claim 1, further comprising nFET transistors having a p-type body electrically coupled to the ground voltage node.

4. The circuit of claim 1, wherein the pFET transistors are always forward body biased when full supply voltage is provided by the supply voltage node.

5. A semiconductor circuit, comprising:
  a supply voltage node to provide a supply voltage; and
  n-channel field effect transistors (nFET transistors) arranged in the circuit as pull down transistors, the nFET transistors having a p-type body electrically coupled to the supply voltage node to forward body bias the nFET transistors, wherein the p-type body and supply voltage node are coupled through a conductor extending continuously from an interface to the p-type body to the supply voltage node such that the p-type body is at the supply voltage.

6. The circuit of claim 5, wherein the interface includes a tap to the p-type body.

7. The circuit of claim 5, wherein the supply voltage is 0.9 volts or less.

8. The circuit of claim 5 further comprising pFET transistors having a n-type body electrically coupled to the supply voltage node.

9. A semiconductor circuit, comprising:

a ground voltage node to provide a ground voltage;

a supply voltage node to provide a supply voltage;

p-channel field effect transistors (pFET transistors) in transistor configurations in the circuit, the pFET transistors having an n-type body electrically coupled to the ground voltage node to forward body bias the pFET transistors, wherein the n-type body and ground voltage node are coupled through a conductor extending continuously from the ground voltage node to an interface to the n-type body such that the n-type body is at the ground voltage; and n-channel field effect transistors (nFET transistors) in transistor configurations in the circuit, the nFET transistors having a p-type body electrically coupled to the supply voltage node to forward body bias the nFET transistors, wherein the p-type body and supply voltage node are coupled through a conductor extending continuously from the supply voltage node to an interface to the p-type body such that the p-type body is at the supply voltage.

10. The circuit of claim 9, wherein the interface to the n-type body includes a tap and the interface to the p-type body includes a tap.

11. The circuit of claim 9, wherein the supply voltage node has a voltage of 0.9 volts or less.

12. The circuit of claim 9, further comprising an isolation structure at least partially between the pFET transistors and the nFET transistors to prevent current from flowing between the n-type body and the p-type body.

13. The circuit of claim 9, wherein the pFET transistors are a first group of pFET transistors and the circuit further comprises a second group of pFET transistors and further comprises an isolation structure at least partially between the first and second groups of pFET transistors to contain the voltage of the n-type body of the first group of pFET transistors.

14. The circuit of claim 13, wherein the isolation structure includes an n-isolation well in which a p-type well is formed and wherein the first group of transistors are formed in the p-type well.

15. The circuit of claim 14, further comprising a second isolation structure which includes a second n-isolation well in which a second p-type well is formed and wherein the second group of transistors are formed in the second p-type well.

16. The circuit of claim 9, wherein the nFET transistors are a first group of nFET transistors and the circuit further comprises a second group of nFET transistors and further comprises a second isolation structure between the first and second groups of nFET transistors to contain the voltage of the p-type body of the first group of nFET transistors.

17. The circuit of claim 9, further comprising additional pFET transistor having an additional n-type body coupled to the ground voltage node and additional nFET transistors having an additional p-type body coupled to the supply voltage node.

18. The circuit of claim 9, wherein the pFET and nFET transistors are MOSFET transistors.

19. A semiconductor circuit, comprising:

p-channel field effect transistors (pFET transistors) having an n-type body;

n-channel field effect transistors (nFET transistors) having a p-type body, the pFET and nFET transistors being in transistor configurations in the circuit;

a supply voltage node coupled to the p-type body to provide a supply voltage signal to the p-type body to forward body bias the nFET transistors, wherein the p-type body and supply voltage node are coupled through a conductor extending continuously from the supply voltage node to an interface to the p-type body such that the p-type body is at the supply voltage; and a ground voltage node coupled to the n-type body to provide a ground voltage signal to the n-type body to forward body bias the pFET transistors, wherein the n-type body and ground voltage node are coupled through a conductor extending continuously from the ground voltage node to an interface to the n-type body such that the n-type body is at the ground voltage.

20. The circuit of claim 19, further comprising additional pFET transistors having an additional n-type body coupled to the ground voltage node and additional nFET transistors having an additional p-type body coupled to the supply voltage node.

21. A semiconductor circuit, comprising:

a ground voltage node to provide a ground voltage; and p-channel field effect transistor (pFET transistors) in transistor configurations in the circuit, each of the pFET transistors having an n-type body electrically coupled to the ground voltage node to forward body bias the pFET transistors and wherein the n-type bodies and ground voltage node are coupled through continuously conductive material from the ground voltage node to interfaces to the n-type bodies such that the n-type body is at the ground voltage.

22. The circuit of claim 21, further comprising additional transistors that share an additional body.

23. The circuit of claim 21, further comprising:

a supply voltage node to provide a supply voltage; and n-channel field effect transistor (nFET transistors) in transistors configurations in the circuit, each of the nFET transistors having a p-type body electrically coupled to the supply voltage node to forward body bias the nFET transistors and wherein the n-type bodies and supply voltage node are coupled through continuously conductive material from the supply voltage node to interfaces to the p-type bodies.

24. The circuit of claim 23, wherein the supply voltage is 0.9 volts or less.

25. A semiconductor circuit, comprising:

a supply voltage node to provide a supply voltage; and n-channel field effect transistors (nFET transistors) arranged in the circuit as pull down transistors, each of the NFET transistors having a p-type body electrically coupled to the supply voltage node to forward body bias the nFET transistors and wherein the n-type bodies and supply voltage node are coupled through continuously conductive material from the supply voltage node to interfaces to the p-type bodies such that the p-type body is at the supply voltage.

26. The circuit of 25, wherein the supply voltage is 0.9 volts or less.

* * * * *